US011848350B2

(12) United States Patent
Haddadi et al.

(10) Patent No.: US 11,848,350 B2
(45) Date of Patent: Dec. 19, 2023

(54) BACK-ILLUMINATED SENSOR AND A METHOD OF MANUFACTURING A SENSOR USING A SILICON ON INSULATOR WAFER

(71) Applicant: KLA Corporation, Milpitas, CA (US)

(72) Inventors: Abbas Haddadi, San Jose, CA (US); Sisir Yalamanchili, Milpitas, CA (US); John Fielden, Los Altos, CA (US); Yung-Ho Alex Chuang, Cupertino, CA (US)

(73) Assignee: KLA Corporation, Milpitas, CA (US)

( * ) Notice: Subject to any disclaimer, the term of this patent is extended or adjusted under 35 U.S.C. 154(b) by 322 days.

(21) Appl. No.: 17/197,292

(22) Filed: Mar. 10, 2021

(65) Prior Publication Data

US 2021/0320144 A1 Oct. 14, 2021

Related U.S. Application Data

(60) Provisional application No. 63/006,724, filed on Apr. 8, 2020.

(51) Int. Cl.
*H01L 27/14* (2006.01)
*H01L 27/146* (2006.01)
*H01L 27/148* (2006.01)

(52) U.S. Cl.
CPC .... *H01L 27/14687* (2013.01); *H01L 27/1464* (2013.01); *H01L 27/14806* (2013.01)

(58) Field of Classification Search
CPC ........... H01L 27/14687; H01L 27/1464; H01L 27/14806
See application file for complete search history.

(56) References Cited

U.S. PATENT DOCUMENTS 3,755,704 A 8/1973 Spindt et al.
3,870,917 A 3/1975 Cuny
(Continued)

FOREIGN PATENT DOCUMENTS

EP 0602983 A1 6/1994
EP 0746871 A1 12/1996
(Continued)

OTHER PUBLICATIONS

U.S. Appl. No. 61/720,700—Certified Copy corres to PCT/EP2013/071080, pp. 1-44.
(Continued)

*Primary Examiner* — Kimberly N Rizkallah
*Assistant Examiner* — Alexander Belousov
(74) *Attorney, Agent, or Firm* — Bever, Hoffman & Harms, LLP (57) ABSTRACT

An image sensor is fabricated by first heavily p-type doping the thin top monocrystalline silicon substrate of an SOI wafer, then forming a relatively lightly p-doped epitaxial layer on a top surface of the top silicon substrate, where p-type doping levels during these two processes are controlled to produce a p-type dopant concentration gradient in the top silicon substrate. Sensing (circuit) elements and associated metal interconnects are fabricated on the epitaxial layer, then the handling substrate and oxide layer of the SOI wafer are at least partially removed to expose a lower surface of either the top silicon substrate or the epitaxial layer, and then a pure boron layer is formed on the exposed lower surface. The p-type dopant concentration gradient monotonically decreases from a maximum level near the top-silicon/epitaxial-layer interface to a minimum concentration level at the epitaxial layer's upper surface.

19 Claims, 8 Drawing Sheets

(56) References Cited

U.S. PATENT DOCUMENTS

| | | |
|---|---|---|
| 3,947,707 A | 3/1976 | Shannon et al. |
| 4,099,198 A | 7/1978 | Howorth et al. |
| 4,210,922 A | 7/1980 | Shannon |
| 4,275,326 A | 6/1981 | Houtkamp |
| 4,348,690 A | 9/1982 | Jastrzebski et al. |
| 4,467,189 A | 8/1984 | Tsuchiya |
| 4,555,731 A | 11/1985 | Zinchuk |
| 4,644,221 A | 2/1987 | Gutierrez et al. |
| 4,760,031 A | 7/1988 | Janesick |
| 4,853,595 A | 8/1989 | Alfano et al. |
| 5,054,683 A | 10/1991 | Haisma et al. |
| 5,120,949 A | 6/1992 | Tomasetti |
| 5,144,630 A | 9/1992 | Lin |
| 5,227,313 A | 7/1993 | Gluck et al. |
| 5,272,096 A | 12/1993 | De Fresart et al. |
| 5,315,126 A | 5/1994 | Field |
| 5,376,810 A | 12/1994 | Hoenk et al. |
| 5,428,392 A | 6/1995 | Castro et al. |
| 5,563,702 A | 10/1996 | Emery et al. |
| 5,717,518 A | 2/1998 | Shafer et al. |
| 5,719,069 A | 2/1998 | Sparks |
| 5,731,584 A | 3/1998 | Beyne et al. |
| 5,742,626 A | 4/1998 | Mead et al. |
| 5,760,809 A | 6/1998 | Malhotra et al. |
| 5,760,899 A | 6/1998 | Eismann |
| 5,852,322 A | 12/1998 | Speckbacher |
| 5,940,685 A | 8/1999 | Loomis et al. |
| 5,999,310 A | 12/1999 | Shafer et al. |
| 6,013,399 A | 1/2000 | Nguyen |
| 6,064,759 A | 5/2000 | Buckley et al. |
| 6,162,707 A | 12/2000 | Dinh et al. |
| 6,201,257 B1 | 3/2001 | Stettner et al. |
| 6,201,601 B1 | 3/2001 | Vaez-Iravani et al. |
| 6,220,914 B1 | 4/2001 | Lee et al. |
| 6,271,916 B1 | 8/2001 | Marxer et al. |
| 6,278,119 B1 | 8/2001 | Nikzad et al. |
| 6,285,018 B1 | 9/2001 | Aebi et al. |
| 6,297,879 B1 | 10/2001 | Yang et al. |
| 6,307,586 B1 | 10/2001 | Costello |
| 6,346,700 B1 | 2/2002 | Cunningham et al. |
| 6,362,484 B1 | 3/2002 | Beyne et al. |
| 6,373,869 B1 | 4/2002 | Jacob |
| 6,403,963 B1 | 6/2002 | Nikzad et al. |
| 6,535,531 B1 | 3/2003 | Smith et al. |
| 6,545,281 B1 | 4/2003 | McGregor et al. |
| 6,608,676 B1 | 8/2003 | Zhao et al. |
| 6,711,283 B1 | 3/2004 | Soenksen |
| 6,837,766 B2 | 1/2005 | Costello |
| 7,005,637 B2 | 2/2006 | Costello et al. |
| 7,039,157 B2 | 5/2006 | Fujii et al. |
| 7,126,699 B1 | 10/2006 | Wihl et al. |
| 7,130,039 B2 | 10/2006 | Vaez-Iravani et al. |
| 7,136,159 B2 | 11/2006 | Tsai et al. |
| 7,141,791 B2 | 11/2006 | Masnaghetti et al. |
| 7,238,583 B2 | 7/2007 | Swain et al. |
| 7,283,166 B1 | 10/2007 | Billman |
| 7,321,468 B2 | 1/2008 | Herkommer et al. |
| 7,345,825 B2 | 3/2008 | Chuang et al. |
| 7,352,457 B2 | 4/2008 | Kvamme et al. |
| 7,432,517 B2 | 10/2008 | Botma et al. |
| 7,446,474 B2 | 11/2008 | Maldonado et al. |
| 7,465,935 B2 | 12/2008 | Urano et al. |
| 7,525,649 B1 | 4/2009 | Leong et al. |
| 7,528,943 B2 | 5/2009 | Brown et al. |
| 7,586,108 B2 | 9/2009 | Nihtianov et al. |
| 7,609,309 B2 | 10/2009 | Brown et al. |
| 7,714,287 B1 | 5/2010 | James et al. |
| 7,741,666 B2 | 6/2010 | Nozaki et al. |
| 7,750,280 B2 | 7/2010 | Hwang et al. |
| 7,791,170 B2 | 9/2010 | Chiang et al. |
| 7,800,040 B2 | 9/2010 | Blacksberg et al. |
| 7,813,406 B1 | 10/2010 | Nguyen et al. |
| 7,838,833 B1 | 11/2010 | Lent et al. |
| 7,875,948 B2 | 1/2011 | Hynecek et al. |
| 7,928,382 B2 | 4/2011 | Hatakeyama et al. |
| 7,952,633 B2 | 5/2011 | Brown et al. |
| 7,985,658 B2 | 7/2011 | Lei et al. |
| 8,017,427 B2 | 9/2011 | Manabe |
| 8,138,485 B2 | 3/2012 | Nihtianov et al. |
| 8,309,443 B2 | 11/2012 | Tanaka et al. |
| 8,323,406 B2 | 12/2012 | Bondokov et al. |
| 8,450,820 B2 | 5/2013 | Nanver et al. |
| 8,455,971 B2 | 6/2013 | Chen et al. |
| 8,513,587 B2 | 8/2013 | Wang et al. |
| 8,514,587 B2 | 8/2013 | Zhang et al. |
| 8,629,384 B1 | 1/2014 | Biellak et al. |
| 8,686,331 B2 | 4/2014 | Armstrong |
| 8,755,417 B1 | 6/2014 | Dribinski |
| 8,803,075 B2 | 8/2014 | Menge et al. |
| 8,873,596 B2 | 10/2014 | Dribinski et al. |
| 8,891,079 B2 | 11/2014 | Zhao et al. |
| 8,929,406 B2 | 1/2015 | Chuang et al. |
| 9,410,901 B2 * | 8/2016 | Chuang ............. H01L 27/14645 |
| 9,426,400 B2 | 8/2016 | Brown et al. |
| 9,478,402 B2 | 10/2016 | Chuang et al. |
| 9,484,431 B1 * | 11/2016 | Chen ............... H01L 21/823814 |
| 9,496,425 B2 * | 11/2016 | Chern ................ G01N 21/9501 |
| 9,529,182 B2 | 12/2016 | Chuang et al. |
| 9,601,299 B2 | 3/2017 | Chuang et al. |
| 9,608,399 B2 | 3/2017 | Chuang et al. |
| 9,620,547 B2 * | 4/2017 | Chuang ............. H01L 27/14698 |
| 9,748,294 B2 | 8/2017 | Muramatsu et al. |
| 9,818,887 B2 * | 11/2017 | Chern ................ G01N 21/8806 |
| 10,121,914 B2 * | 11/2018 | Chern ................ G01N 21/9501 |
| 10,197,501 B2 | 2/2019 | Chuang et al. |
| 10,269,842 B2 | 4/2019 | Masaharu et al. |
| 10,283,551 B2 * | 5/2019 | Muramatsu ......... H01L 27/1464 |
| 10,446,696 B2 * | 10/2019 | Chern ................ H01L 27/1462 |
| 10,748,730 B2 | 8/2020 | Chuang et al. |
| 11,114,489 B2 * | 9/2021 | Chuang ............. H01L 27/14687 |
| 11,114,491 B2 * | 9/2021 | Chuang ............. H01L 27/14685 |
| 11,268,911 B2 * | 3/2022 | Delgado ............. G02B 5/0891 |
| 2001/0017344 A1 | 8/2001 | Aebi |
| 2003/0043876 A1 | 3/2003 | Lublin et al. |
| 2003/0222579 A1 | 12/2003 | Habib et al. |
| 2004/0021061 A1 | 2/2004 | Bijkerk |
| 2004/0056279 A1 | 3/2004 | Niigaki et al. |
| 2004/0227070 A1 | 11/2004 | Bateman et al. |
| 2005/0122021 A1 | 6/2005 | Smith et al. |
| 2005/0167575 A1 | 8/2005 | Benz et al. |
| 2005/0190452 A1 | 9/2005 | Govorkov et al. |
| 2005/0196059 A1 | 9/2005 | Inoue et al. |
| 2005/0233493 A1 | 10/2005 | Augusto et al. |
| 2005/0264148 A1 | 12/2005 | Maldonado et al. |
| 2006/0054778 A1 | 3/2006 | Suhling |
| 2006/0055321 A1 | 3/2006 | Maldonado et al. |
| 2006/0069460 A1 | 3/2006 | Smith et al. |
| 2006/0170324 A1 | 8/2006 | Machuca et al. |
| 2006/0188869 A1 | 8/2006 | Zeskind et al. |
| 2007/0002465 A1 | 1/2007 | Chuang et al. |
| 2007/0020893 A1 | 1/2007 | Ueno et al. |
| 2007/0034987 A1 | 2/2007 | Costello et al. |
| 2007/0064135 A1 | 3/2007 | Brown et al. |
| 2007/0096648 A1 | 5/2007 | Nakajima et al. |
| 2007/0103769 A1 | 5/2007 | Kuwabara |
| 2007/0188744 A1 | 8/2007 | Leslie et al. |
| 2007/0235829 A1 | 10/2007 | Levine et al. |
| 2007/0291810 A1 | 12/2007 | Luo et al. |
| 2008/0044932 A1 | 2/2008 | Samoilov et al. |
| 2008/0173903 A1 | 7/2008 | Imai et al. |
| 2008/0315092 A1 | 12/2008 | Kley |
| 2008/0315121 A1 | 12/2008 | Nihtianov et al. |
| 2009/0021717 A1 | 1/2009 | Nihtianov et al. |
| 2009/0045325 A1 | 2/2009 | Tomuta et al. |
| 2009/0091752 A1 | 4/2009 | Terasawa et al. |
| 2009/0108207 A1 | 4/2009 | Liu |
| 2009/0125242 A1 | 5/2009 | Choi et al. |
| 2009/0128912 A1 | 5/2009 | Okada et al. |
| 2009/0168152 A1 | 7/2009 | Gelernt et al. |
| 2009/0180176 A1 | 7/2009 | Armstrong et al. |
| 2009/0324234 A1 | 12/2009 | Kashima |
| 2010/0102213 A1 | 4/2010 | Garris |
| 2010/0103409 A1 | 4/2010 | Ohshima et al. |
| 2010/0140675 A1 | 6/2010 | Rhodes |

(56) References Cited

U.S. PATENT DOCUMENTS

| | | | |
|---|---|---|---|
| 2010/0148667 A1 | 6/2010 | Niigaki et al. | |
| 2010/0188655 A1 | 7/2010 | Brown et al. | |
| 2010/0208979 A1 | 8/2010 | Abbott et al. | |
| 2010/0233869 A1 | 9/2010 | Park et al. | |
| 2011/0073982 A1 | 3/2011 | Armstrong et al. | |
| 2011/0101219 A1 | 5/2011 | Uchiyama et al. | |
| 2011/0116077 A1 | 5/2011 | Chuang et al. | |
| 2011/0168886 A1 | 7/2011 | Shadman et al. | |
| 2011/0169116 A1 | 7/2011 | Nanver et al. | |
| 2011/0234790 A1 | 9/2011 | True | |
| 2011/0256655 A1 | 10/2011 | Nikzad et al. | |
| 2011/0261354 A1 | 10/2011 | Sinfield et al. | |
| 2011/0291109 A1 | 12/2011 | Wraback et al. | |
| 2012/0007920 A1 | 1/2012 | Takahashi | |
| 2012/0012811 A1 | 1/2012 | Deflumere et al. | |
| 2012/0012957 A1 | 1/2012 | Larsen et al. | |
| 2012/0081684 A1 | 4/2012 | Den et al. | |
| 2012/0132823 A1 | 5/2012 | Menge et al. | |
| 2012/0160993 A1 | 6/2012 | Nevet et al. | |
| 2012/0170021 A1 | 7/2012 | Walsh | |
| 2012/0217558 A1 | 8/2012 | Togashi | |
| 2012/0228485 A1 | 9/2012 | Iwakiri et al. | |
| 2012/0268722 A1 | 10/2012 | Nihtianov et al. | |
| 2013/0009069 A1 | 1/2013 | Okada | |
| 2013/0016346 A1 | 1/2013 | Romanovsky et al. | |
| 2013/0017205 A1 | 1/2013 | Giaccia et al. | |
| 2013/0020491 A1 | 1/2013 | Mazzillo | |
| 2013/0056843 A1 | 3/2013 | Lee et al. | |
| 2013/0077086 A1 | 3/2013 | Chuang et al. | |
| 2013/0082241 A1 | 4/2013 | Kub et al. | |
| 2013/0088706 A1 | 4/2013 | Chuang et al. | |
| 2013/0126705 A1 | 5/2013 | Maleev | |
| 2013/0169957 A1 | 7/2013 | Wolf et al. | |
| 2013/0176552 A1 | 7/2013 | Brown et al. | |
| 2013/0264481 A1* | 10/2013 | Chern | H01L 27/1462 |
| | | | 257/432 |
| 2013/0270663 A1 | 10/2013 | Lin et al. | |
| 2013/0313440 A1 | 11/2013 | Chuang et al. | |
| 2013/0320211 A1 | 12/2013 | Park et al. | |
| 2013/0334638 A1 | 12/2013 | Chen et al. | |
| 2013/0336574 A1 | 12/2013 | Nasser-Ghodsi et al. | |
| 2013/0341504 A1 | 12/2013 | Neill et al. | |
| 2014/0151552 A1 | 6/2014 | Jiang et al. | |
| 2014/0203386 A1 | 7/2014 | Bui et al. | |
| 2014/0246595 A1 | 9/2014 | Menge et al. | |
| 2014/0302630 A1 | 10/2014 | Tian et al. | |
| 2014/0305367 A1 | 10/2014 | Chuang et al. | |
| 2014/0362203 A1 | 12/2014 | Delaney et al. | |
| 2015/0007765 A1 | 1/2015 | Dribinski | |
| 2015/0260659 A1* | 9/2015 | Chuang | H01L 27/14643 |
| | | | 257/292 |
| 2015/0294998 A1 | 10/2015 | Nihtianov et al. | |
| 2016/0290932 A1* | 10/2016 | Chern | H01L 27/1464 |
| 2016/0315114 A1* | 10/2016 | Chuang | H01L 27/14609 |
| 2018/0047857 A1* | 2/2018 | Chern | H01L 27/14806 |
| 2018/0061872 A1 | 3/2018 | Ohtani et al. | |
| 2018/0315747 A1 | 11/2018 | Agam et al. | |
| 2019/0131465 A1* | 5/2019 | Chern | H01L 27/14685 |
| 2019/0386054 A1* | 12/2019 | Chuang | H01L 27/1462 |
| 2020/0194476 A1* | 6/2020 | Chuang | H01L 27/14685 |
| 2021/0320144 A1* | 10/2021 | Haddadi | H01L 27/14687 |

FOREIGN PATENT DOCUMENTS

| | | |
|---|---|---|
| EP | 1939917 A2 | 7/2008 |
| EP | 2346094 A1 | 7/2011 |
| JP | H08241977 A | 9/1996 |
| JP | H10171965 A | 6/1998 |
| JP | 2002033473 | 1/2002 |
| JP | 2004031452 A | 1/2004 |
| JP | 2007013177 A | 1/2007 |
| JP | 2007040909 A | 2/2007 |
| JP | 2007086108 A | 4/2007 |
| JP | 2009117454 A | 5/2009 |
| JP | 2010003755 A | 1/2010 |
| KR | 100688497 B1 | 3/2007 |
| KR | 100826407 B1 | 5/2008 |
| RU | 2297070 C2 | 4/2007 |
| WO | 9532518 A1 | 11/1995 |
| WO | 9617372 A1 | 6/1996 |
| WO | 2007035858 A2 | 3/2007 |
| WO | 2011091159 A1 | 7/2011 |
| WO | 2013006867 A1 | 1/2013 |
| WO | 2014067754 A2 | 5/2014 |

OTHER PUBLICATIONS

Allen et al., Work Function, Photoelectric Threshold, and Surface . . . ; Physical Review, vol. 127, No. 1, Jul. 1, 1962, pp. 150-158.

Armstrong, Carter M.The Quest for the Ultimate Vacuum Tube, Spectrum IEEE, Dec. 2015, 4 pgs.

Ding, MengField Emission from Silicon, MIT 2001, 277 pgs.

Fanton et al., Multiparameter Measurements of Thin Film . . . , Journal of Applied Physics, vol. 73, No. 11, p. 7035 (1993).

Field Emitter Review, 7 pgs in Japanese.

Fowler, R. H., et al., Electron Emission in Intense Electric Fields, Mar. 31, 1928, 9 pgs.

Fu et al., Optimizing GaN photocathode structure for higher . . . ; Optik, vol. 123, No. 9, May 2012, pp. 756-768.

Hecht, Optics, Fourth Edition, India: Pearson Education Pte, Ltd. 2004.

Hecht, Optics, Second Edition, Adelphi University, 1987, Addison-Wesley Publishing Company, Inc., 3 pages.

Henderson, Brian S., Study of Negative Electron Affinity . . . , Dept. of Physics, Rice Univ., Aug. 7, 2009, 18 pgs.

Howorth et al., Transmission silicon photoemitters . . . , Jrnl of Physics D: Applied Physics, vol. 9, No. 5, Apr. 1, 1976, pp. 785-794.

ISR and Written Opinion dated Mar. 31, 2014 for PCT/US2013/074124 (P3725-PCT).

Janesick, James R., Scientific Charge-Coupled Devices, SPIE Press, 2001, pp. 556-561.

KLA-Tencor Coporation, filed U.S. Appl. No. 62/059,368, filed Oct. 3, 2014 and entitled "183nm Laser and Inspection System" (P4496PRV/KLA-068PRV).

Koike, AkifumiField Emitter Equipped With a Suppressor to Control Emission Angel, IEEE Electron Device Letters, vol. 34, No. 5, May 2013, 3 pgs.

Martinelli, Ramon U., Infrared Photoemission from Silicon, Applied Physics Letters, vol. 16, No. 7, Apr. 1, 1970, pp. 261-262.

Martinelli, Ramon U., Reflection and Transmission Secondary Emission . . . , Applied Physics Letters, vol. 17, No. 8, Oct. 15, 1970, pp. 313-314.

Nagao, Masayoshi, Cathode Technologies for Field Emission Displays, IEEJ Trans 2006; 1:171-178, 8 pgs.

Nagao, MasayoshiFabrication of a Field Emitter Array with a Built-In Einzel Lens, JJAP 48 (2008) 06FK02, 4 pgs.

Nanver et al., Pure-Boron Chemical-Vapor-Deposited Layers: a New Material for Silicon Device Processing, 18th IEEE International Conference on Advanced Thermal Processing of Semiconductors (RTP), Sep. 28, 2010-Oct. 1, 2010, pp. 136-139.

Nanver, Silicon Photodiodes for Low Penetration Depth Beams such as DUV/VUV/EUV Light and Low-Energy Electrons, Advances in Photodiodes, G. Betta, ed., Mar. 22, 2011, pp. 205-224, www.intechopen.com.

Neo, Yoichiro, et al., article entitled "Electron Optical Properties of Microcolumn with Field Emitter", JJAP 52 (2013) 036603, 5 pgs.

Omatsu et al., High repetition rate Q-switching performance . . . , Optics Express vol. 14, Issue 7, pp. 2727-2734, Apr. 3, 2006.

Pain; et al., "Pain et al., "A Back-Illuminated Megapixel CMOS Image Sensor", Jun. 9, 2005, IEEE Workshop on Charge-Coupled Devices and Advanced Image Sensors, Karuizawa, Japan, 4 pgs.".

Rakhshandehroo, M.R. et al., Fabrication of a self-aligned silicon field emission . . . , JVSTB, 16, 765 (1998); doi: 10.1116/1,589900, 6 pgs.

Rakhshandehroo, M.R. et al., Field emission from gated Si emitter tips with precise . . . , JVSTB, 15, 2777 (1997); doi: 10.1116/1.589726, 6 pgs.

(56) References Cited

OTHER PUBLICATIONS

Raoult, Efficient generation of narrow-bandwidth . . . , Jul. 15, 1998, vol. 23, No. 14, Optics Letters, pp. 1117-1119.
Sakic, Agata, Boron-layer silicon photodiodes for high-efficiency low-energy electron detection, Solid-State Electronics 65-66 (2011), pp. 38-44.
Sarubbi et al., Pure boron-doped photodiodes . . . IEEE, Sep. 15, 2008, pp. 278-281.
Sarubbi, Francesco et al., article entitled "Chemical Vapor Deposition of α-Boron Layers on Silicon for Controlled Nanometer-Deep p+ n Junction Formation", Journal of Electronic Materials, vol. 39, No. 2, 2010.
Sato, T., et al, Fabrication and characterization of HfC coated . . . , J. Vac. Sci. Technol. B 2194), published Jul. 31, 2003, 5 pgs.
Serbun, Pavel et al., article entitled "Stable field emission of single B-doped . . . ", JVSTB, 31, 02B101 (2013); doi: 10.1116/1.4765088, 7 pgs.
Sobieski, Stanley, Intensified Charge Coupled Devices For Ultra Low Light Level Imaging, NASA, Goddard Space Flight Center, SPIE vol. 78 (1976) Low Light Level Devices, pp. 73-77.
Tobin, Kenneth W., Inspection in Semiconductor Manufacturing, Webster's Encyclopedia of Electrical and Electronic Engineering, vol. 10, pp. 242-262, Wiley & Sons, NY, NY, 1999.
Utsumi, Takao, Vacuum Microelectrnoics: What's New and Exciting, IEEE vol. 38, No. 10, Oct. 1991, 8 pgs.
Xiaogian, Fu, Higher Quantum Efficiency by Optimizing . . . 978-1-4244-6644-3/10 IEEE, pp. 234-235.

\* cited by examiner

BACK-ILLUMINATED SENSOR AND A METHOD OF MANUFACTURING A SENSOR USING A SILICON ON INSULATOR WAFER

RELATED APPLICATIONS/PATENTS

This application claims priority from U.S. Provisional Patent Application No. 63/006,724, entitled "BACK-ILLUMINATED SENSOR AND A METHOD OF MANUFACTURING A SENSOR USING A SILICON ON INSULATING WAFER", which was filed on Apr. 8, 2020, and is incorporated by reference herein. This application also is related to U.S. application Ser. No. 16/562,396, entitled "BACK-ILLUMINATED SENSOR AND A METHOD OF MANUFACTURING A SENSOR" filed on Sep. 5, 2019, and to U.S. Pat. Nos. 9,496,425, 9,818,887, 10,121,914, and 10,446,696, all to Chern et al., and all entitled "Back-illuminated sensor with boron layer". These patents and applications are incorporated herein by reference.

FIELD OF THE DISCLOSURE

The present application relates to image sensors suitable for sensing radiation in deep UV (DUV) and vacuum UV (VUV) wavelengths, and to methods for making such image sensors. These sensors are suitable for use in photomask, reticle, or wafer inspection systems and for other applications.

RELATED ART

The integrated circuit industry requires inspection tools with increasingly higher resolution to resolve ever smaller features of integrated circuits, photomasks, reticles, solar cells, charge coupled devices etc., as well as detect defects whose sizes are of the order of, or smaller than, those feature sizes.

Inspection systems operating at short wavelengths, e.g. wavelengths shorter than about 250 nm, can provide such resolution in many cases. In particular for photomask or reticle inspection, it is desirable to inspect using a wavelength identical, or close, to the wavelength that will be used for lithography, i.e. close to 193.4 nm for current generation lithography and close to 13.5 nm for future EUV lithography, as the phase-shifts of the inspection light caused by the patterns will be identical or very similar to those caused during lithography. For inspecting semiconductor patterned wafers, inspection systems operating over a relatively broad range of wavelengths, such as a wavelength range that includes wavelengths in the near UV, DUV, and/or VUV ranges, can be advantageous because a broad range of wavelengths can reduce the sensitivity to small changes in layer thicknesses or pattern dimensions that can cause large changes in reflectivity at an individual wavelength.

In order to detect small defects or particles on photomasks, reticles, and semiconductor wafers, high signal-to-noise ratios are required. High photon flux densities are required to ensure high signal-to-noise ratios when inspecting at high speed because statistical fluctuations in the numbers of photons detected (Poisson noise) is a fundamental limit on the signal-to-noise ratio. In many cases, approximately 100,000 or more photons per pixel are needed. Because inspection systems are typically in use 24 hours per day with only short stoppages, the sensors are exposed to large doses of radiation after only a few months of operation.

A photon with a vacuum wavelength of 250 nm has energy of approximately 5 eV. The bandgap of silicon dioxide is about 10 eV. Although it may appear such wavelength photons cannot be absorbed by silicon dioxide, silicon dioxide as grown on a silicon surface must have some dangling bonds at the interface with the silicon because the silicon dioxide structure cannot perfectly match that of the silicon crystal. In addition, because the single dioxide is amorphous, there will be dangling bonds within the material. In practice, there will be a non-negligible density of defects and impurities within the oxide, as well as at the interface to underlying semiconductor, that can absorb photons with DUV wavelengths, particularly those shorter than about 250 nm in wavelength. Furthermore, under high radiation flux density, two high-energy photons may arrive near the same location within a very short time interval (nanoseconds or picoseconds), which can lead to electrons being excited to the conduction band of the silicon dioxide by two absorption events in rapid succession or by two-photon absorption.

A further requirement for sensors used for inspection, metrology and related applications is high sensitivity. As explained above, high signal-to-noise ratios are required. If the sensor does not convert a large fraction of the incident photons into signal, then a higher intensity light source would be required in order to maintain the same inspection or measurement speed compared with an inspection or metrology system with a more efficient sensor. A higher intensity light source would expose the instruments, optics and the sample being inspected or measured to higher light intensities, possibly causing damage or degradation over time. A higher intensity light source would also be more expensive or, particularly at DUV and VUV wavelengths, may not be available. Silicon reflects a high percentage of DUV and VUV light incident on it. For example, near 193 nm in wavelength, silicon with a 2 nm oxide layer on its surface (such as a native oxide layer) reflects approximately 65% of the light incident on it. Growing an oxide layer of about 21 nm on the silicon surface reduces the reflectivity to close to 40% for wavelengths near 193 nm. A detector with 40% reflectivity is significantly more efficient than one with 65% reflectivity, but lower reflectivity, and hence higher efficiency, is desirable.

DUV and VUV wavelengths are strongly absorbed by silicon. Such wavelengths may be mostly absorbed within about 10 nm or a few tens of nm of the surface of the silicon. The efficiency of a sensor operating at DUV or VUV wavelengths depends on how large a fraction of the electrons created by the absorbed photons can be collected before the electrons recombine. Silicon dioxide can form a high-quality interface with silicon with a low density of defects. Most other materials including many of those commonly used for anti-reflection coatings, if deposited directly on silicon, result in a very high density of electrical defects at the surface of silicon. A high density of electrical defects on the surface of silicon may not be an issue for a sensor intended to operate at visible wavelengths, as such wavelengths may typically travel about 100 nm or more into the silicon before being absorbed and may, therefore, be little affected by electrical defects on the silicon surface. However, DUV and VUV wavelengths are absorbed so close to the silicon surface that electrical defects on the surface and/or trapped charges within the layer(s) on the surface can result in a significant fraction of the electrons created recombining at, or near, the silicon surface and being lost, resulting in a low efficiency sensor.

U.S. Pat. Nos. 9,496,425, 9,818,887 and 10,121,914, all to Chern et al., describe image sensor structures and methods of making image sensors that include a boron layer deposited on, at least, an exposed back surface of the image sensor.

Different ranges of temperature for deposition of the boron are disclosed, including a range of about 400-450° C. and a range of about 700-800° C. The inventors have discovered that one advantage of a higher deposition temperature for the boron, such as a deposition temperature between about 600° C. and about 900° C., is that at such temperatures boron diffuses into the silicon providing a very thin, heavily p-type doped silicon layer on the light-sensitive back surface. This p-type doped silicon layer is important for ensuring a high quantum efficiency to DUV and VUV radiation because it creates a static electric field near the surface that accelerates electrons away from the surface into the silicon layer. The p-type silicon also increases the conductivity of the back surface of the silicon, which is important for high-speed operation of an image sensor, since a return path is needed for ground currents induced by the switching of signals on electrodes on the front surface of the sensor.

However, processing temperatures higher than 450° C. cannot be used on semiconductor wafers that include conventional CMOS circuits because 450° C. is close to the melting point of metals such as aluminum and copper commonly used in fabricating CMOS devices. At high temperatures, such as those greater than 450° C., these metals expand, become soft and can delaminate. Furthermore, at high temperatures copper can easily diffuse through silicon which will modify the electrical properties of the CMOS circuits. Thinning a wafer before any metals are deposited on it allows a boron layer to be deposited on the back surface as described in the aforementioned patents at a temperature between 600 and 900° C. enabling boron to diffuse into the surface during, or subsequent to, the deposition of the boron layer. Subsequently metal interconnects can be formed on the front surface. After the image sensor regions of the wafer have been thinned, for example to a thickness of about 25 μm or thinner, the thinned region can be significantly warped and may have peak-to-valley non-flatness of many tens of microns or more. So, it is necessary to use relatively wide metal interconnect lines and vias, such as multiple microns wide or more, to ensure that the lines and vias connect in spite of any misalignment caused by the non-flatness. Such wide metal interconnects and vias increase the capacitance per unit area associated with those lines and vias. Furthermore, wide interconnects and vias can make it difficult, or impossible, to interconnect all the signals on a large area sensor with about one million or more pixels. In some cases, polysilicon jumpers may be needed to connect metal interconnects, but polysilicon has much higher resistivity than any metal, so the use of such jumpers can limit the maximum operating speed of a sensor.

Therefore, a need arises for an image sensor capable of efficiently detecting high-energy photons without degrading yet overcoming some, or all, of the above disadvantages. In particular, a method of fabricating a back-thinned image sensor with a boron layer and boron doping on its backside surface while allowing formation of metal interconnects on a relatively flat wafer (i.e. with a flatness of about 10 μm or less) would allow the use of finer design rules (such as the design rules corresponding to a 0.35 μm process or finer). Such a method would allow narrower metal lines connecting to critical features such as the floating diffusion, enabling smaller floating-diffusion capacitance and higher charge to voltage conversion efficiencies. Finer design rules also allow more interconnect lines per unit area of the sensor and allow more flexibility in connecting the circuits on the image sensor.

SUMMARY OF THE DISCLOSURE

Image sensors and methods of fabricating image sensors with high-quantum-efficiency (high QE) for imaging DUV, VUV, EUV, X-rays and/or charged particles (such as electrons) on SOI wafers are described. These image sensors are capable of long-life operation under high fluxes of radiation. These methods include process steps to form light sensitive active and/or passive circuit elements in a layer of semiconductor material (preferably silicon), as well as forming metal interconnections between the electrical elements of the sensor. These image sensors can include fine metal interconnects and vias (such as those conforming to about 0.35 μm, or finer, design rules), while having a backside surface coated with an amorphous boron layer and having a highly doped p-type silicon layer immediately adjacent to the boron layer. The metal interconnections may comprise tungsten, aluminum, copper or other metals used in fabricating interconnects in known CMOS processes.

An exemplary method of fabricating an image sensor begins by utilizing a boron layer to highly p-dope the thin top silicon substrate of a silicon on insulator (SOI) wafer, and then generating an epitaxial layer on the top silicon substrate in a manner that generates a monotonically decreasing p-type dopant concentration gradient (doping profile) having a maximum concentration level of p-type dopant (e.g., boron) atoms in the top silicon substrate (i.e., near the bottom of the epitaxial layer) and a minimum concentration level of p-type dopant atoms near the top surface of the epitaxial layer. Doping the thin top silicon substrate is performed, for example, by forming an amorphous boron layer on the top silicon substrate, performing a boron drive-in anneal at a high temperature (i.e., 800° C. or higher), and then removing the boron layer during or after the drive-in anneal (i.e., before forming the epitaxial layer). Generating the epitaxial layer with the desired doping gradient involves growing intrinsic or lightly p-doped epitaxial silicon on the top silicon substrate at the high temperature (i.e., at least 800° C.) such that boron diffusion from the highly p-doped thin top silicon into the epitaxial silicon produces the desired p-type dopant concentration gradient in the epitaxial silicon. Circuit elements are then formed on the upper (relatively low p-doped) surface of the epitaxial layer using, for example, standard CMOS fabrication processes, and then metal interconnects (lines and vias) are formed to connect together those circuit elements. Then the thick handling substrate and intermediate insulator layer of the SOI wafer are thinned (i.e., at least partially removed) to expose a backside (lower) surface of either the top silicon substrate or the epitaxial layer to increase the sensitivity of the image sensor to light impinging the active sensor backside surface regions. In some embodiments some or all of the top silicon substrate is removed during the thinning process to maximize the p-type doping level of the exposed backside surface regions. In one embodiment the removal of the handling substrate, insulator/oxide and top silicon substrate is performed using known dry etching, wet etching, and/or mechanical polishing techniques. A permanent (second) amorphous pure boron layer is then formed directly on the exposed backside surface region, and one or more optional anti-reflection layers are formed on the surface of the second amorphous boron layer. In an alternative embodiment, a thin metal coating may be deposited on the boron layer to facilitate the detection of charged particles (e.g., electrons), EUV or X-rays. Such a thin metal coating may also reduce to sensitivity of the sensor to stray light, may protect the surface of the sensor, and may facilitate in-situ cleaning of contaminants, such as carbon and organic molecules from the sensor surface.

Another method of fabricating an image sensor involves producing an epitaxial layer having the monotonically decreasing doping concentration gradient described above and then forming circuit elements and interconnects on the epitaxial layer using the processes described above. An optional protective layer is then formed on/over the circuit elements, and then a second handling wafer is bonded over the circuit elements and interconnects. At least a portion of the SOI wafer (i.e., the entire handling substrate, the insulator/oxide layer and some or all the top silicon substrate) are then removed to expose a backside sensor surface formed by either the remaining top silicon substrate or epitaxial layer material, where the exposed backside sensor surface defines a maximum boron doping concentration level of the monotonically decreasing doping concentration gradient (i.e., the boron doping concentration level monotonically decreases from the exposed backside sensor surface and the upper surface of the epitaxial layer on which the circuit elements are formed). The subsequently formed pure boron layer is then deposited at a temperature at or below 450° C. by chemical vapor deposition (CVD) or molecular beam epitaxy (MBE), an optional protective layer is then formed, and then one or more anti-reflection coating layers are formed by an atomic-layer deposition (ALD) or other process that can be performed below 450° C. in order to prevent heat-related damage to the circuit elements and interconnects.

The image sensors described herein may be fabricated using CCD (charge coupled device) or CMOS (complementary metal oxide semiconductor) technology. The image sensors may be two-dimensional (2D) area sensors, or one-dimensional (1D) line sensors.

DETAILED DESCRIPTION OF THE DRAWINGS

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

The following description is presented to enable one of ordinary skill in the art to make and use the disclosure as provided in the context of a particular application and its requirements. As used herein, directional terms such as "top," "bottom,", "front," "frontside", "backside," "over," "under," "upper," "upward," and "lower" are intended to provide relative positions for purposes of description and are not intended to designate an absolute frame of reference. Various modifications to the preferred embodiment will be apparent to those with skill in the art, and the general principles defined herein may be applied to other embodiments. Therefore, the present disclosure is not intended to be limited to the embodiments shown and described but is to be accorded the widest scope consistent with the principles and novel features herein disclosed.

Figure 1:
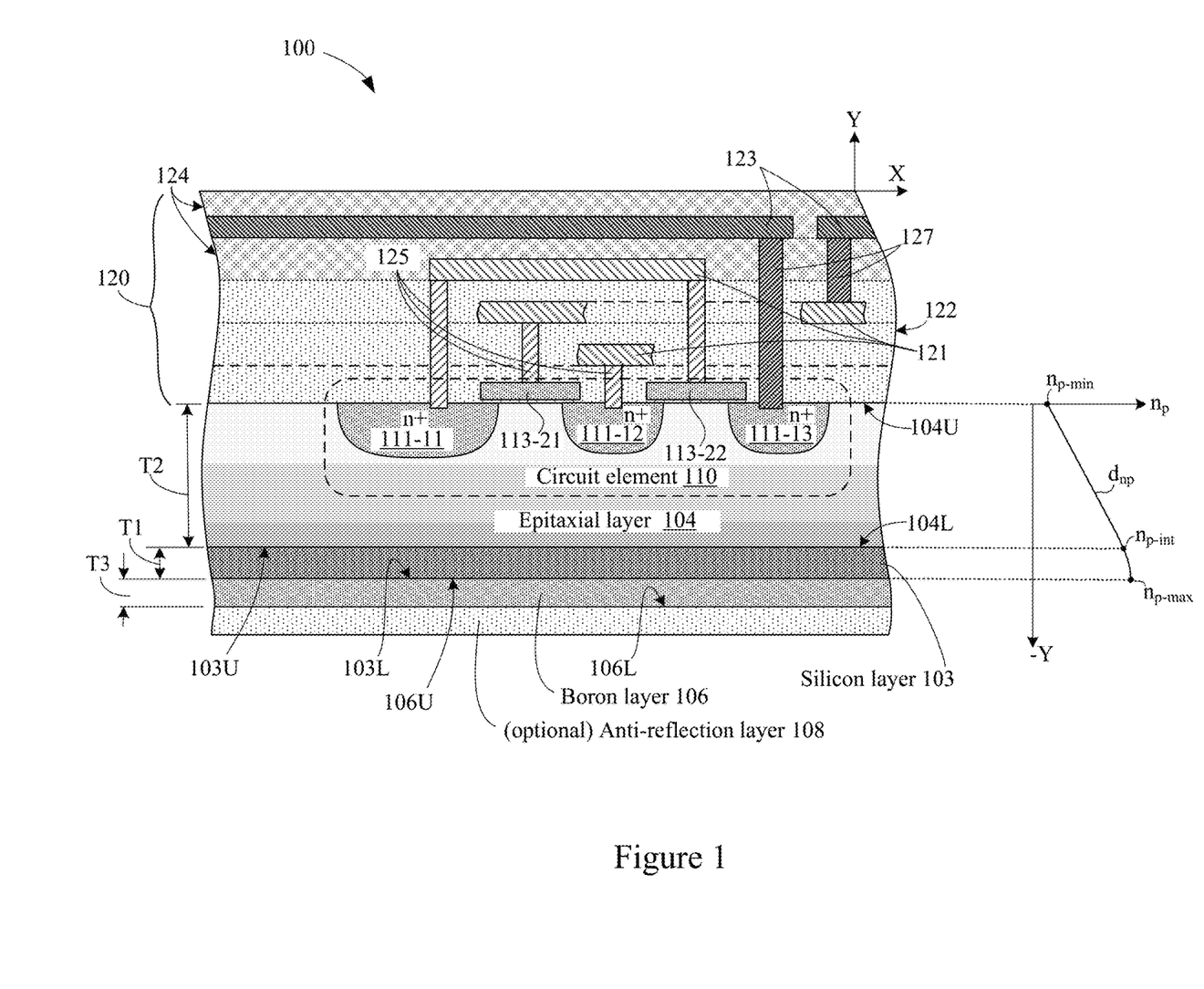
FIG. 1 is a cross-sectional view showing an exemplary image sensor produced in accordance with the present invention.

FIG. 1 is a cross-sectional side view depicting a portion of an image sensor 100 configured to sense deep ultraviolet (DUV) radiation, vacuum ultraviolet (VUV) radiation, extreme ultraviolet (EUV) radiation or charged particles according to an exemplary embodiment of the present invention. Image sensor 100 generally includes a silicon substrate 103, an epitaxial layer 104 disposed on an upper surface 103U of silicon substrate 103, at least one circuit element 110 and associated interconnects 120 disposed on an upper surface 104U of epitaxial layer 104, a pure boron layer 106 disposed on a lower surface 103L of silicon substrate 103, and an optional anti-reflection coating 108 disposed on a lower (backside or outward-facing) surface 106L of pure boron layer 106.

Silicon substrate 103 is a relatively heavily p-doped monocrystalline silicon layer having an upper surface 103U that forms a silicon-substrate/epitaxial-layer interface with a lower surface 104L of epitaxial layer 104, and a lower surface 103L of silicon substrate 103 forms a silicon/boron interface with an upper surface 106U of pure boron layer 106. In one embodiment a thickness T1 of silicon substrate 103 is in a range of 5 nm to 100 nm.

Epitaxial layer 104 is a layer of monocrystalline silicon that is homoepitaxially grown other otherwise formed on upper surface 103U using fabrication techniques described below. In one embodiment, epitaxial layer 104 has a thickness T2 in the range of 10 μm to 40 μm.

Circuit element 110 and interconnects 120 are formed on (i.e., into and/or over) an upper surface 104U of epitaxial layer 104 using known semiconductor fabrication techniques, and include a sensor device (e.g., a light sensitive device such as a photodiode) and associated control transistors. As used herein, the phrase "circuit element" refers to light sensitive devices such as charge-coupled devices and photodiodes, other semiconductor devices such as transistors, diodes, resistors and capacitors, and the term "interconnects" refers to electrical interconnections (often called metal lines and vias) that pass signals between semiconductor devices. The circuit elements mentioned herein are formed using standard semiconductor manufacturing processes including, but not limited to, photolithography, deposition, etching, diffusion, ion implantation, and annealing. In the exemplary embodiment depicted in FIG. 1, circuit element 110 includes spaced-apart n+ doped diffusion regions 111-11, 111-12 and 111-13 that extend from upper surface 104U into corresponding portions of epitaxial layer 104, and polycrystalline silicon (polysilicon) gate structures 113-21 and 113-22 that are respectively separated from upper surface 104U by intervening gate oxide layers. Interconnects 120 include first metal lines 121 formed in/on a first dielectric region 122, second metal lines 123 formed in a second dielectric layer 124, first metal vias 125 and second metal vias 127, all of which being formed over circuit element 110 and are operably electrically connected to associated regions of circuit element 110 using known techniques. First metal lines 121 are formed in or on one or more dielectric layers 122 deposited over circuit element 110, and first metal vias 125 extend through dielectric layers 122 using known via formation techniques. Second metal lines 123 are formed in one or more second dielectric layers 124 that are disposed over first metal lines 111, and second metal vias 127 extend through one or both dielectric layers 112 and 122. In one embodiment, a protection layer (not shown in FIG. 1) is formed between first metal lines 121 and second metal lines 123, and all second metal vias 127 comprise at least one of tungsten, aluminum and copper and extend through this protection layer. The exemplary diffusion regions and gate structures forming circuit element 110 depicted in FIG. 1, along with the exemplary metal interconnects 120, are arbitrarily configured for illustrative purposes and provided solely to for purposes of describing exemplary circuit element structures and is not intended to represent a functional sensor device or to limit the appended claims.

Pure boron layer 106 and optional anti-reflection coating 108 are formed using techniques described below during backside processing performed after the formation of circuit elements 110 and interconnects 120. Pure boron layer 106 comprises a boron concentration of 80% or higher with inter-diffused silicon atoms and oxygen atoms predominantly making up the remaining 20% or less. In one embodiment pure boron layer 106 has a thickness T3 in the range of 2 nm to 20 nm. In one specific embodiment, thickness T3 of pure boron layer 106 is in the range of 3 nm to 10 nm, and an optional protective layer (e.g., a thin metal layer, not shown) and one or more anti-reflection coating (e.g., silicon dioxide) layers 108 are deposited on a lower (outward-facing) surface 106L of pure boron layer 106. Additional structures and details regarding image sensors produced in accordance with the present invention are provided in the following exemplary production method descriptions.

Referring to right side of FIG. 1, according to an aspect of the invention, silicon substrate 103 and epitaxial layer 104 are processed using methods described below to exhibit a p-type (e.g., boron) dopant concentration gradient $d_{np}$ having a maximum concentration level $n_{p-max}$ that occurs at a backside sensor surface, which in the depicted embodiment coincides with lower surface 103L of silicon substrate 103, and monotonically decreases in the Y-axis direction from maximum concentration level $n_{p-max}$ to a minimum doping concentration level $n_{p-min}$ occurring at upper surface 104U of epitaxial layer 104. In one embodiment, maximum concentration level $n_{p-max}$ is in a range of about $10^{18}$ cm$^{-3}$ (i.e., $10^{18}$ boron atoms per cubic centimeter) to $10^{21}$ cm$^{-3}$, and minimum doping concentration level $n_{p-min}$ is in a range of about $10^{13}$ cm$^{-3}$ to $10^{14}$ cm$^{-3}$. In one embodiment, the portion of dopant concentration gradient $d_{np}$ generated within silicon substrate 103 is substantially flat (i.e., such that an intermediate dopant level $n_{p-int}$ occurring at the silicon-substrate/epitaxial-layer interface defined by lower surface 104L and upper surface 103U is substantially equal to maximum concentration level $n_{p-max}$ at lower surface 103L).

Figure 2:
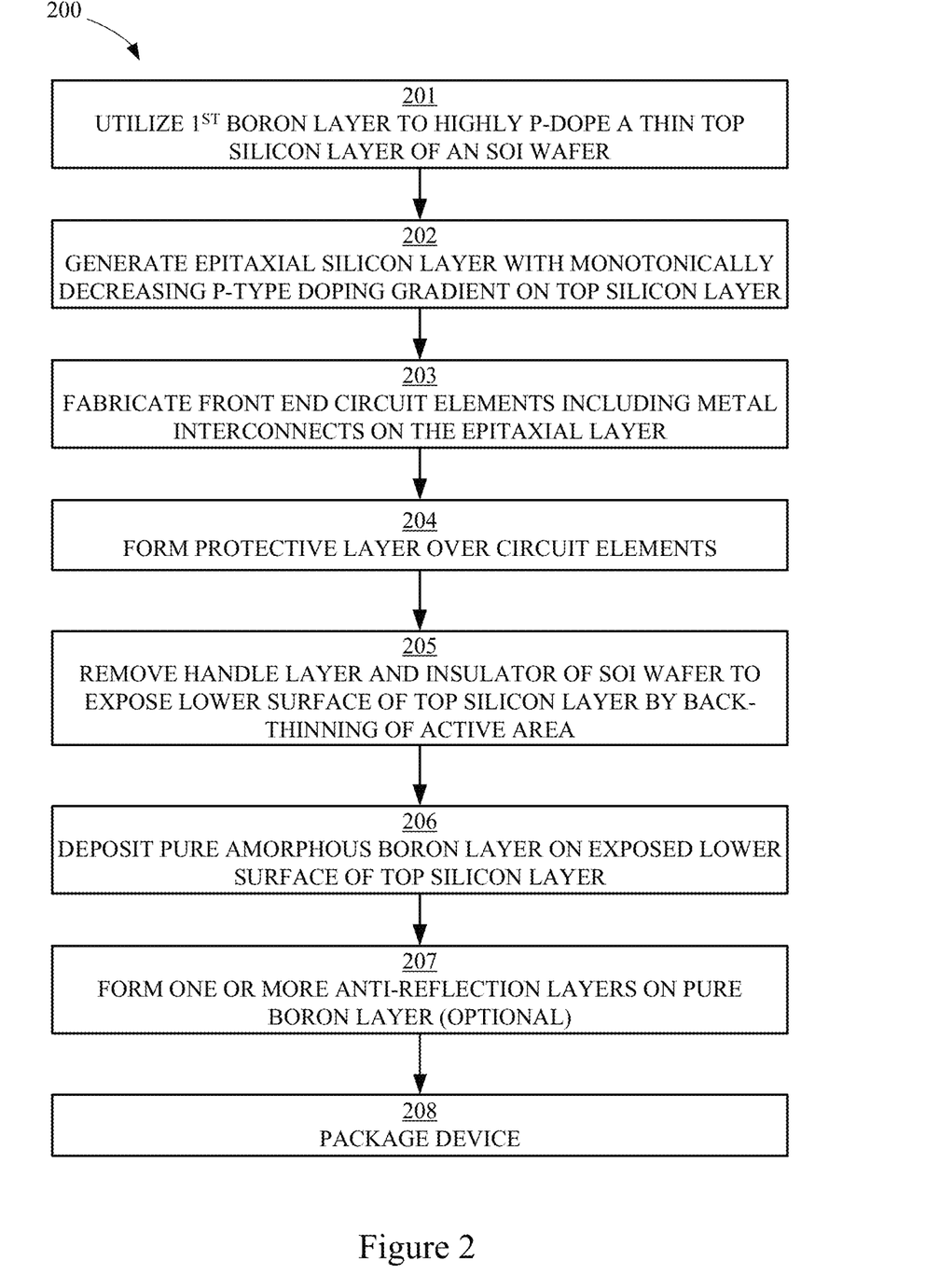
FIG. 2 is a flow diagram illustrating an exemplary method for fabricating an image sensor according to an embodiment.
Figure 3A:
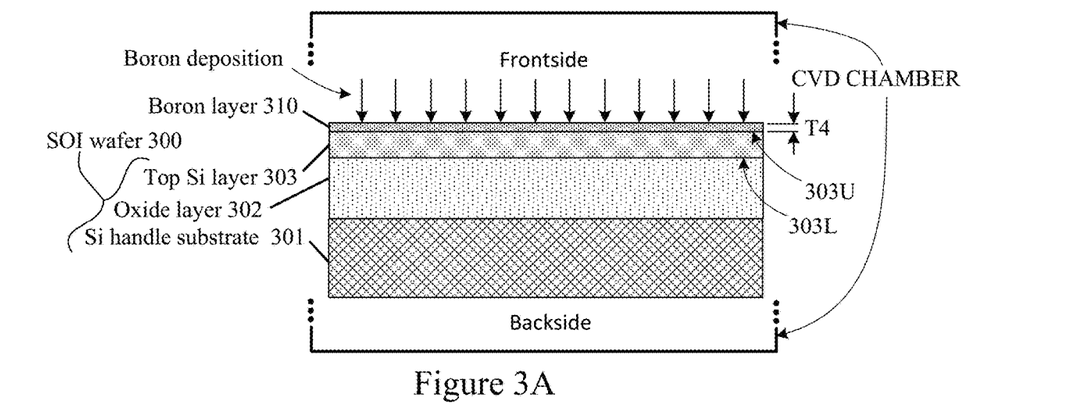
FIGS. 3A, 3B, 3C, 3D, 3E, and 3F are cross-sectional side views illustrating exemplary processes utilized to fabricate an image sensor according to the method of FIG. 2.

FIG. 2 illustrates an exemplary method 200 for fabricating an image sensor using a silicon on insulator (SOI) wafer, and FIGS. 3A to 3F depict an exemplary SOI wafer at various process stages during the execution of method 200. Referring to FIG. 3A, at the beginning of the fabrication process SOI wafer 300 includes a relatively thin top (frontside) silicon substrate 303 having an exposed upper (first) surface 303U and an opposing lower (second) surface 303L that is attached to a relatively thick handling substrate 301 by way of an intervening insulator (oxide) layer 302. SOI wafer 300 is fabricated or procured prior to the beginning of the fabrication process, with handling wafer 301 and oxide layer 302 having standard compositions and thicknesses. In preferred embodiments SOI wafer 300 is characterized such that top silicon substrate 303 has a thickness in the range of 5 to 100 nm and consists of either intrinsic or lightly p-type doped monocrystalline silicon.

Referring to block 201 (FIG. 2), a boron layer is utilized to generate a high boron doping concentration level (i.e., $10^{18}$ cm$^{-3}$ or greater) in the top silicon substrate of an SOI wafer by way of a boron diffusion process. In an embodiment depicted in FIGS. 3A and 3B, utilization of a boron layer 310 to produce the desired high boron doping concentration level in the top silicon substrate of SOI wafer 300 includes forming first boron layer 310 (shown and described with reference to FIG. 3A) and then processing SOI wafer 300 (shown and described with reference to FIG. 3B) to perform both boron drive-in and boron removal either sequentially or simultaneously.

Referring to FIG. 3A, boron layer 310 is formed on upper surface 303U and comprises pure amorphous boron (as defined herein) having a thickness T4 in the range of 2 nm to 10 nm. In a preferred embodiment, boron layer 310 is formed using a chemical vapor deposition (CVD) process while SOI wafer 300 is disposed in a CVD chamber and heated to a high temperature in a range of 600° C. to 800° C. In other embodiments, other processes may be utilized to generate boron layer 310 (e.g., sputtering or a molecular beam epitaxy (MBE)), provided the resulting boron deposition is pure and clean.

Figure 3B:
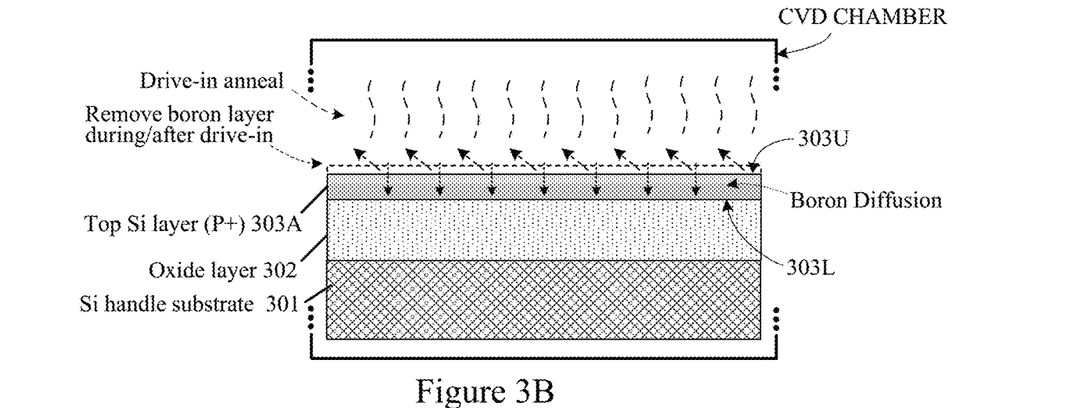

FIG. 3B depicts SOI wafer 300 during or after the processing used to both generate the desired high boron doping concentration level and to completely remove boron layer 310 from upper surface 303U. Note that the top silicon substrate is identified using reference number 303A in FIG. 3B, where the suffix "A" is utilized to distinguish the highly p-doped silicon resulting from the boron diffusion process from the initially lightly doped top silicon substrate 303 of FIG. 3A. In a preferred embodiment, the boron diffusion is performed in situ (e.g., using the same CVD chamber utilized to form boron layer 310) using a CVD boron drive-in anneal process performed at a temperature in the range of 800° C. to 900° C. In other embodiments the boron may be driven in at high temperature using any clean chamber in an $H_2$ or $N_2$ atmosphere. In a preferred embodiment, boron removal is also performed in situ immediately after boron deposition (i.e., simultaneously with the boron drive-in) in a hydrogen environment at a temperature in a range of 800° C. to 900° C., whereby boron diffuses through upper surface 303U into top silicon substrate 303A while the exposed portion of boron layer 310 reacts with the hydrogen and leaves the boron layer's surface. Under these conditions, a typical removal rate of boron layer 310 is 3 nm to 5 nm in a period of 30 to 60 minutes (i.e., thinner boron layers require less than 30 minutes and thicker layers require more than one hour). After boron layer 310 has completely disappeared, top silicon substrate 303A is highly doped (e.g., with a boron concentration level in the range of $10^{18}$ to $10^{21}$ cm$^{-3}$) and the dopant profile will be relatively uniform. A benefit provided by performing both boron layer formation and processing (i.e., drive-in and removal) in situ is that epitaxial growth (described below with reference to FIG. 3C) can be performed immediately after completing boron layer removal (i.e., without requiring an additional cleaning process). In an alternative embodiment, SOI wafer 300 is removed from the deposition/diffusion chamber and boron layer 310 is removed using nitric acid dip (or other oxidizing dip), then epitaxial growth is performed after carrying out cleaning oxides from upper surface 303U.

Figure 3C:
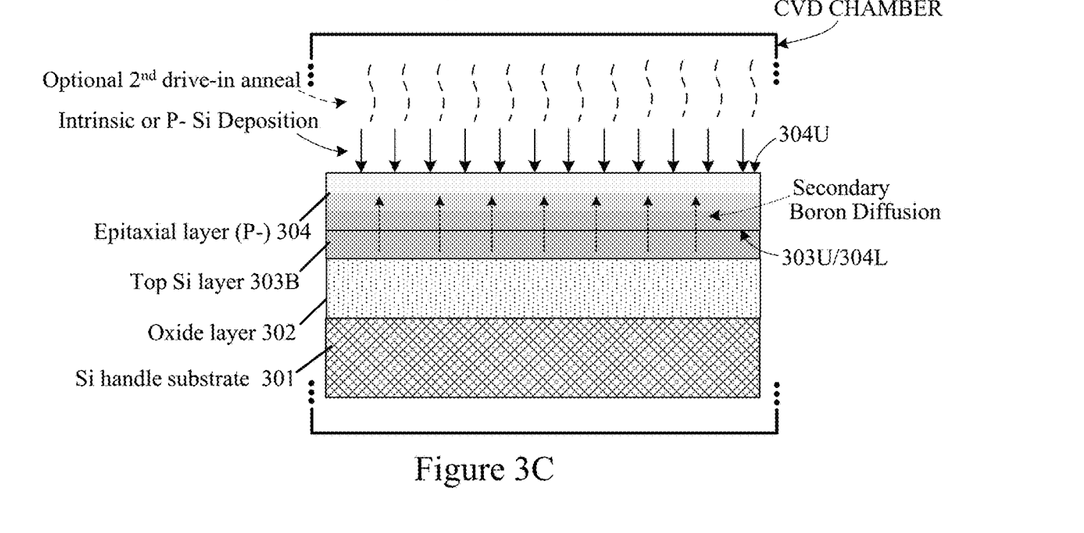

Referring to block 202 (FIG. 2), an epitaxial silicon layer is then generated on/over the top silicon substrate in a manner that provides the epitaxial layer with a monotonically decreasing boron concentration gradient (e.g., gradient $d_{np}$ shown and described above with reference to FIG. 1). In one embodiment, intrinsic or lightly p-doped epitaxial silicon is grown on the upper surface of the heavily doped top silicon substrate under conditions that enhance boron diffusion from the top silicon substrate into the epitaxial layer material at a rate that produces the desired monotonically decreasing boron concentration gradient. FIG. 3C illustrates the SOI wafer after epitaxial layer 304 is formed on/over upper surface 303U during which a secondary boron diffusion generates the desired doping gradient (e.g., gradient $d_{np}$, described with reference to FIG. 1). Note that the suffix "B" is used to indicate the difference between top silicon substrate 303B after the secondary born diffusion and heavily p-doped top silicon substrate 303A (FIG. 3B). In one preferred embodiment epitaxial layer 304 is grown in situ immediately after removal of the boron layer using the decomposition of at least one of a silane or a chlorosilane gas (e.g. $SiH_4$, $SiCl_4$, $SiHCl_3$, $SiH_2C_{12}$ or $SiH_3Cl$) with hydrogen at a temperatures in a range of 800° C. to 1250° C. in a CVD process. Diborane may be added to the gas mixture for low p-type doping in the epitaxial layer during the CVD process. In some embodiments the silicon epitaxy may be performed using molecular beam epitaxy (MBE). In some embodiments a drive-in anneal at a temperature greater than 800° C. may be performed after the epitaxial silicon growth to cause p-type dopant (e.g., boron) atoms to migrate (diffuse) from the heavily p-doped top silicon substrate into epitaxial layer 304 to create the desired monotonically decreasing doping concentration gradient from top silicon substrate 303B into epitaxial layer 304.

Figure 3D:
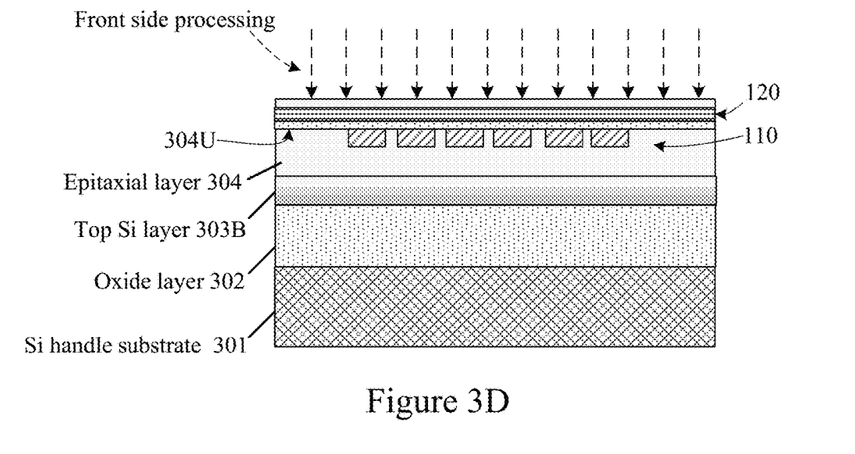

Referring to block 203 (FIG. 2) and FIG. 3D, frontside circuit structures (elements) 110 and associated interconnects 120 are then fabricated on/over the epitaxial layer 304 using standard semiconductor fabrication processes, such as lithography, deposition, etching, ion-implantation, and annealing. The purpose and additional details related to these elements and interconnects are provided above with reference to FIG. 1, so details are omitted here for brevity. Charge-coupled device (CCD) and/or CMOS sensor elements and devices may also be created during the fabrication process of block 203. The frontside elements and devices are created in epitaxial layer 304 on the front side of the SOI wafer, and therefore are referred to as frontside circuit elements. During frontside processing the formation of poly-Si interconnects and metal interconnects may also be performed along with other high temperature processes. Because interconnects 120 are formed on the wafer prior to the back-thinning process (described below), these interconnects can be formed using normal sub-micron CMOS processing techniques and may include multiple layers of high-density metal interconnects. The interconnects may be formed by Al, Cu, or another metal.

Referring to block 204 (FIG. 2), an optional protective layer is formed over the circuit elements to protect them during subsequent processing (described below). Referring to the upper portion of FIG. 3E, protective layer 320 is indicated as being formed over interconnects 120. In some embodiments protective layer 320 may comprise a silicon nitride layer deposited using plasma enhanced chemical vapor deposition (PECVD), among many other materials.

Figure 3E:
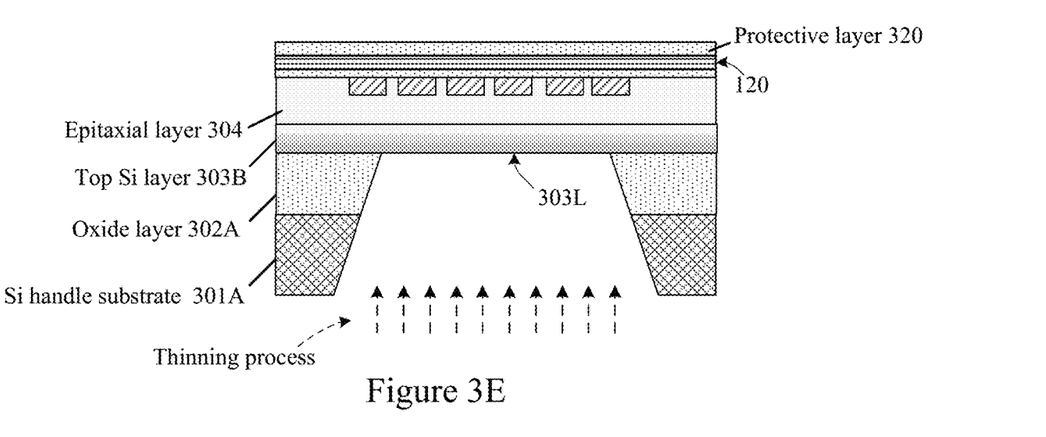

Referring to block 205 (FIG. 2) and FIG. 3E, a backside thinning process is then performed to remove (thin) at least a portion of the handling silicon substrate and at least a portion of oxide layer to expose lower surface 303L of top silicon substrate 303B in a photoactive area of the image sensor. In the depicted embodiment this removal (thinning) process is performed by grinding and/or etching handling and oxide material to expose a portion of lower surface 303L, which represents the backside sensor surface (i.e., the light sensitive area of the back illuminated image sensor), while retaining residual handling wafer portions 301A and residual oxide layer portions 302A around exposed lower surface 303L of top silicon substrate 303B. The etching can be performed by wet etching methods using alkaline solutions such as KOH or TMAH among others. The silicon substrate-oxide interface between the handling substrate and the oxide layer acts a natural etch stop for wet etching. The oxide layer can be removed using hydrofluoric acid and/or buffered oxide etch. The top silicon-oxide interface between the top silicon substrate and the oxide layer acts as a natural etch stop for the oxide etch. Alternatively, the silicon and oxide layers can also be removed using dry etching methods such as reactive ion etching (RIE) and/or inductively coupled plasma reactive ion etching (ICPRIE) with etching gases such as $SF_6$, $O_2$, and $C_4F_8$ etc. among others. As described below with reference to FIGS. 6A to 6C, some or all of the top silicon substrate may also be removed during the thinning process, whereby the backside sensor surface would be formed by epitaxial layer 304.

Figure 3F:
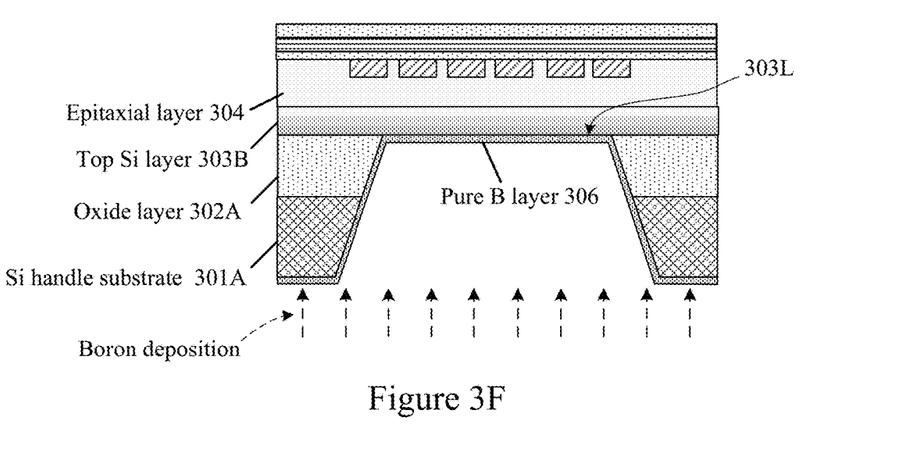

Referring to block 206 (FIG. 2) and FIG. 3F, a pure boron layer 306 and an optional antireflection layer (not shown) are then deposited over the exposed lower surface 303L of top silicon substrate 303B (or, alternatively, the exposed lower surface of epitaxial layer 304 where top silicon substrate 303B has been removed). In preferred embodiments lower surface 303L is cleaned and prepared before performing the boron deposition. In one embodiment this cleaning can be performed using standard RCA 1 and 2 cleaning processes with dilute HF or buffered oxide etch to remove the surface oxide after RCA 1 and 2 cleans. In preferred embodiments the high purity boron deposition is performed using a combination of diborane and hydrogen at a low temperature (i.e., less than 450° C., such as a temperature in a range of 300° C. to 450° C.) to avoid any damage to the frontside metal interconnects in a CVD process. The thickness of boron layer 306 is determined based on the target wavelength range of operation of the completed image sensor and the minimum thickness needed to avoid pin holes. Typical thicknesses may range between 2-20 nm. The time for which the wafer is kept at elevated temperatures must be kept to a minimum to avoid damage of the frontside metal interconnects.

As indicated in block 208 (bottom of FIG. 2), the completed image sensor is then packaged in some embodiments. The package may include flip-chip bonding or wire bonding of a chip to a substrate. The package may include a window that transmits wavelengths of interest or may comprise a flange or seal for interface to a vacuum seal. In electron-bombarded image sensor embodiments, the package may include other components such as a photocathode as well as a sealed, evacuated tube.

Figure 4:
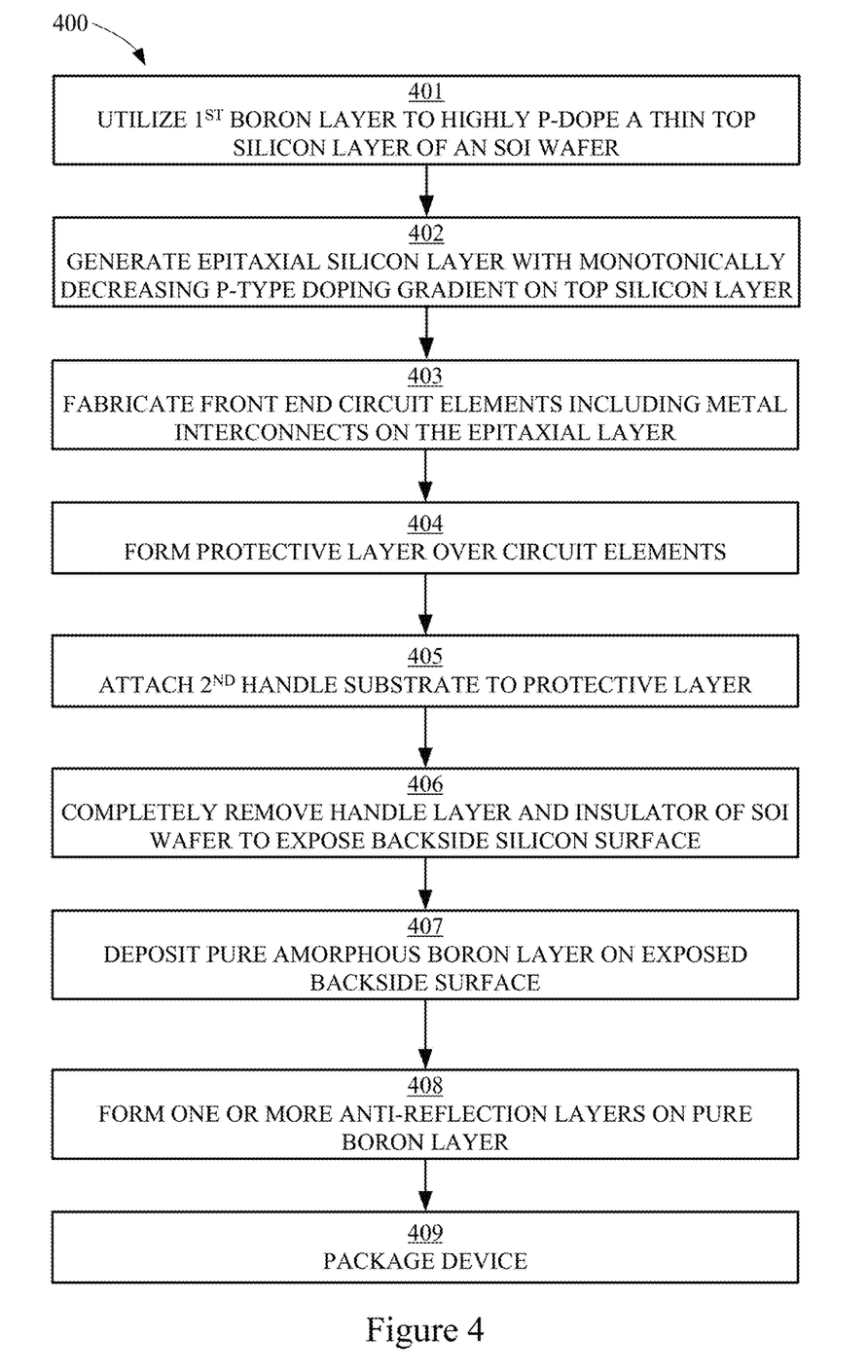
FIG. 4 is a flow diagram illustrating an exemplary method for fabricating an image sensor according to another embodiment.
Figure 5A:
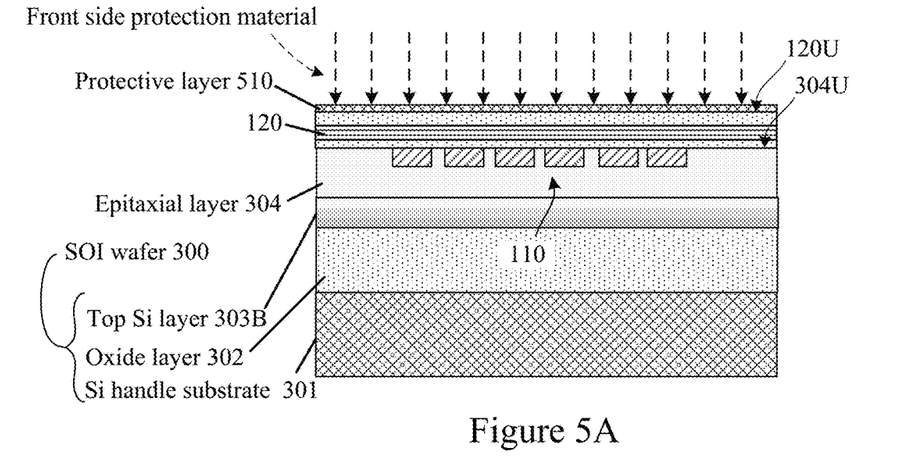
FIGS. 5A, 5B, 5C, 5D and 5E are cross-sectional side views illustrating exemplary processes utilized to fabricate an image sensor according to the method of FIG. 4.

FIG. 4 illustrates an alternative exemplary method 400 for fabricating an image sensor starting with a silicon on insulator (SOI) wafer, and FIGS. 5A to 5E depict an exemplary SOI wafer at various process stages during the execution of method 400. For brevity, processes and structures generated by method 400 that are substantially identical to those described above with reference to process 200 (FIGS. 2 and 3A-3C) are incorporated into FIGS. 5A to 5E. For example, FIG. 5A depicts the processed layers of SOI wafer 300 after the completion of processes associated with blocks 201 and 202 (FIG. 2) and blocks 401 and 402 (FIG. 4), where top Si layer 303B is connected to Si handling substrate 301 by way of intervening oxide (insulator) layer 302, epitaxial layer 304 is formed on top silicon substrate 303B in a manner that generates the monotonically changing doping concentration gradient described above. The description provided above with reference to FIGS. 3A and 3B is understood as describing similar exemplary processes performed in association with blocks 401 and 402, and therefore will not be repeated here. Similarly, FIG. 5A depicts circuit elements 110 and interconnects 120 that are formed on upper surface 304U of epitaxial layer 304 according to block 203 (FIG. 2) and block 403 (FIG. 4).

Referring to block 404 (FIG. 4) and FIG. 5A, a frontside protection material (e.g., silicon nitride) is deposited or otherwise formed using known fabrication processes (e.g., PECVD) on upper surface 120U over interconnects 120, which were previously fabricated on epitaxial layer 304 in the manner described above with reference to FIG. 3C.

Figure 5B:
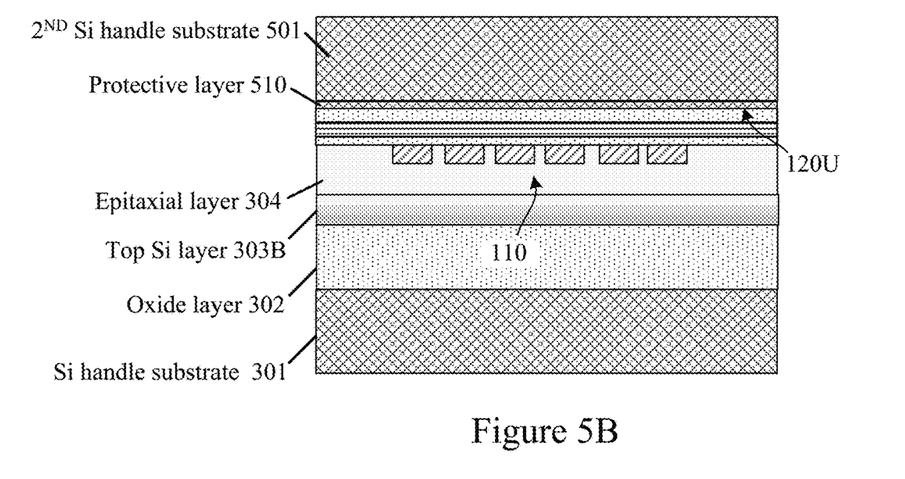

Referring to block 405 (FIG. 4) and FIG. 5B, a handling wafer (second handling substrate) 501 is then attached to the frontside (e.g., to upper surface 510U of protective layer 510) using known techniques, whereby handling wafer 501 functions to further protect the elements and interconnects formed on epitaxial layer 304 and to serve as a base wafer for the backside processing stages described below. In exemplary embodiments, handling wafer 501 comprises a silicon wafer, a quartz wafer, or a wafer made of another suitable material. In some embodiments handling wafer 501 may be attached directly to upper surface 120U (i.e., by omitting intervening protection layer 510). In an alternative embodiment (not shown), protective layer 510 can be used instead of, or in addition to, handling wafer 501 (i.e., a second handling substrate may be omitted). In one embodiment, additional via structures (not shown) are formed through handling wafer 501 to facilitate frontside connection to circuit elements 110.

Figure 5C:
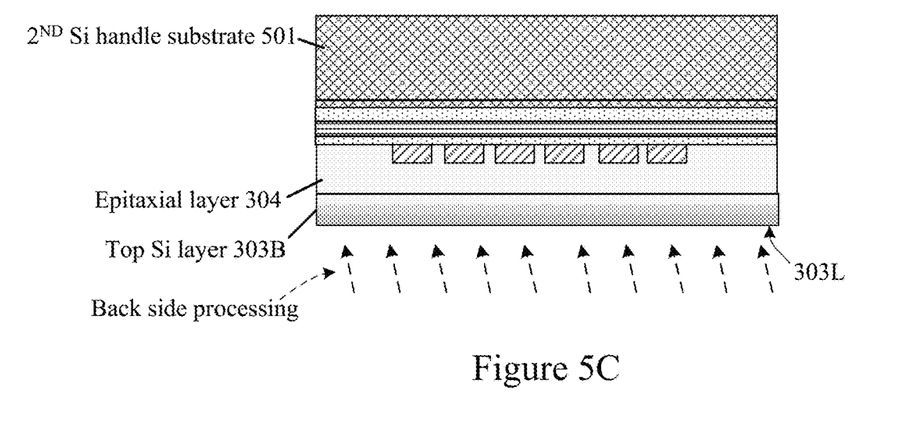

Referring to block 406 (FIG. 4) and FIG. 5C, backside processing is then performed to (at least partially) remove the handling substrate and oxide layer of the starting SOI wafer such that a backside sensor surface (e.g., lower surface 303L of top silicon substrate 303B) is exposed. In one embodiment the removal process is performed using a combination of grinding and/or etching processes described above with reference to FIG. 3E, including cleaning and processing of lower surface 303L in preparation for the subsequent boron layer formation. In this step, some or all of the top silicon substrate 303B may be removed by, for example, etching or polishing.

Figure 5D:
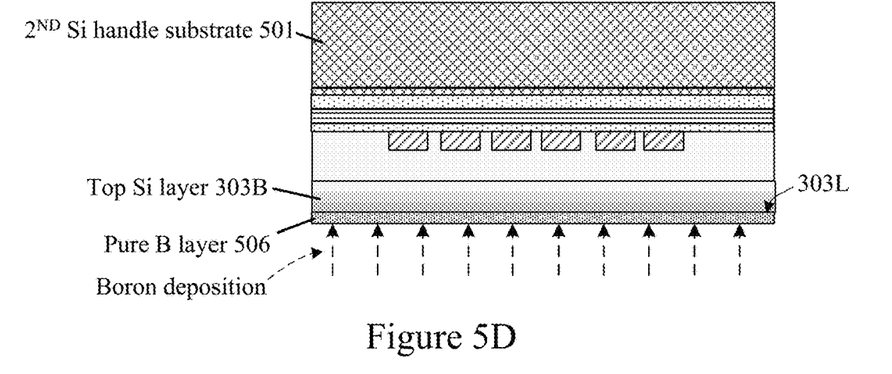

Referring to block 407 (FIG. 4) and FIG. 5D, a pure boron layer 506 is then formed on lower surface 303L of top silicon substrate 303B, for example, using the processes described above with reference to FIG. 3F.

Figure 5E:
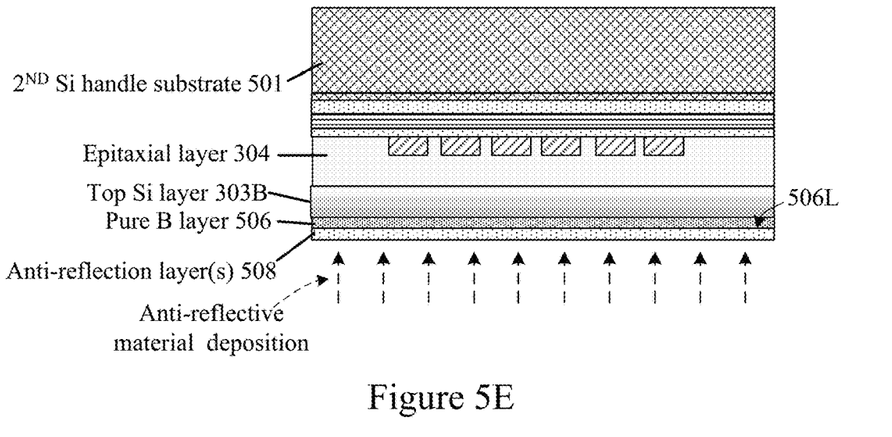

Referring to block 408 (FIG. 4) and FIG. 5E, an antireflective material is deposited or otherwise formed on lower surface 506L of pure boron layer 506 to produce one or more anti-reflective layers 508. At least one of the layers may be deposited using an ALD process or other process that require temperatures below 450° C. In an alternative embodiment, a thin metal coating may be deposited on boron layer 506 (i.e., in place of or in addition to anti-reflective layer 508). The thin metal coating may be particularly useful when the sensor is used to detect charged particles (such as electrons), EUV or X-rays. Such a thin metal coating may reduce to sensitivity of the sensor to stray light, may protect the surface of the sensor, and may facilitate in-situ cleaning of contaminants, such as carbon and organic molecules from the sensor surface.

As indicated in block 409 (FIG. 4), the completed image sensor shown in FIG. 5E can then be packaged using any of the packaging techniques described above.

Figure 6A:
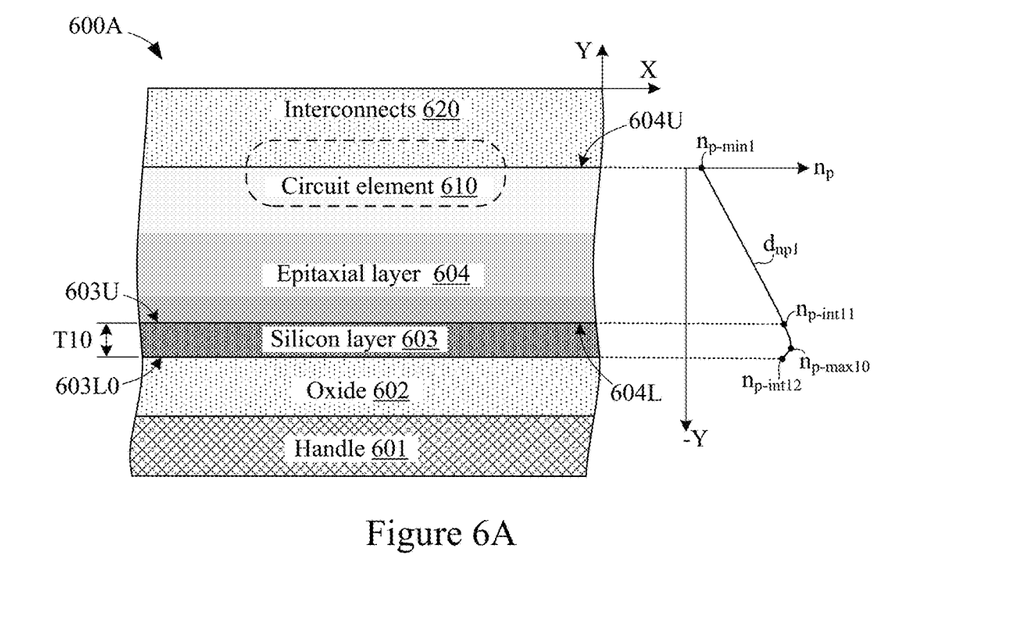
FIGS. 6A, 6B and 6C are cross-sectional side views illustrating exemplary processes utilized to fabricate an image sensor according to another embodiment of the present invention.
Figure 6B:
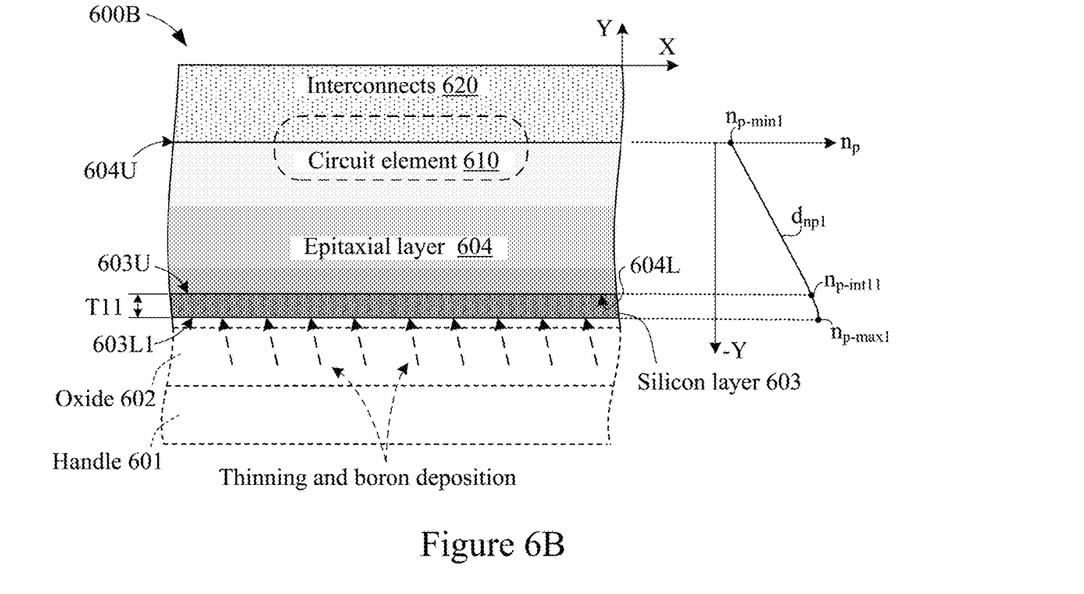
Figure 6C:
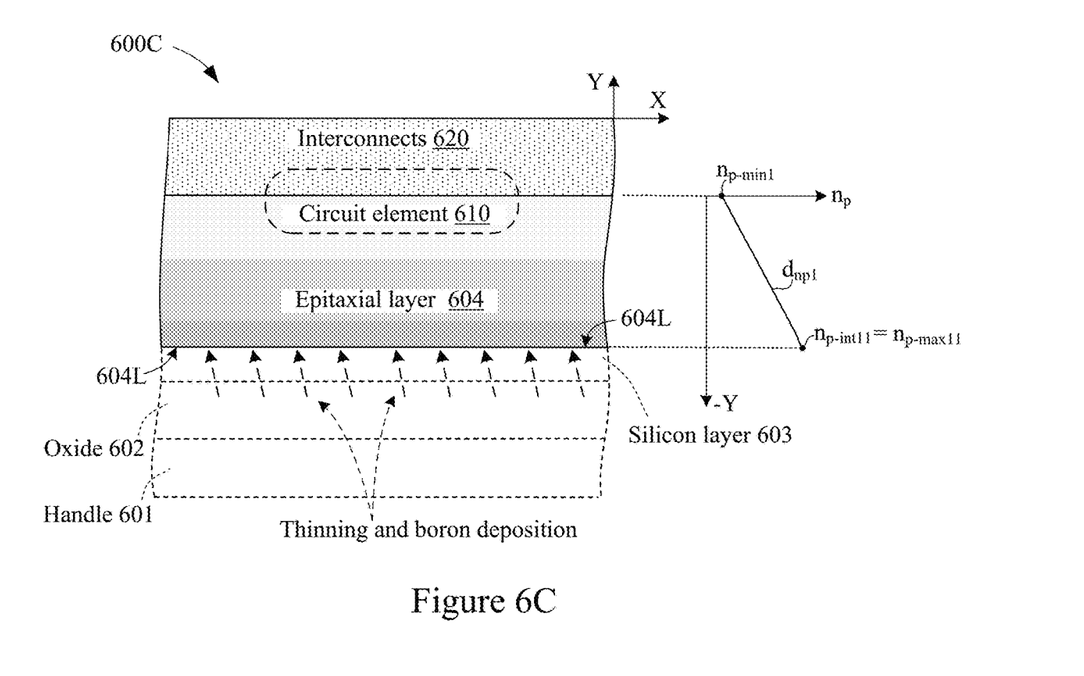

FIGS. 6A to 6C illustrate exemplary conditions under which a doping profile generated in the top silicon substrate requires the removal of some or all of the top silicon substrate (i.e., along with the handling substrate and oxide layer of the original SOI wafer) during the backside thinning processes described above with reference to FIGS. 3E and 5C. That is, referring briefly to FIG. 1, an exemplary ideal top silicon doping profile is depicted by the portion of gradient $d_{np}$ extending between maximum boron concentration level $n_{p\text{-}max}$ and intermediate doping concentration $n_{p\text{-}int}$, where maximum boron concentration level $n_{p\text{-}max}$ occurs at lower surface 103U and the doping concentration monotonically decreases (or remains flat) between lower surface 103U and the top-silicon/epitaxial layer interface. When this ideal top silicon doping profile is generated, the backside thinning process may be terminated after the handling substrate and oxide layer of the SOI wafer are removed (i.e., without having to remove any of the top silicon substrate). However, in reality, the maximum boron concentration level occurs somewhere between the upper and lower surfaces of the top silicon substrate, which requires the removal of at least some of the top silicon substrate, as described below with reference to FIGS. 6B and 6C.

FIG. 6A depicts a partially completed sensor 600A formed on an SOI wafer having a top silicon substrate 603 that is attached to a handling substrate 601 by way of an intervening insulator (oxide) layer 602 after a boron layer (not shown) has been utilized to a high boron doping concentration level in top silicon substrate 603, and after epitaxial layer 604 has been formed on top silicon substrate 603 such that boron diffusion from said top silicon substrate 603 generates a boron doping concentration gradient $d_{np1}$ that monotonically decreases in the epitaxial layer 604 from an original maximum boron concentration level $n_{p\text{-}max10}$ disposed adjacent to upper surface 603U of top silicon substrate 603 to a minimum boron doping concentration level $n_{p\text{-}min1}$ disposed adjacent to upper surface 604U of epitaxial layer 604. Note however, that maximum boron concentration level $n_{p\text{-}max10}$ occurs at a level located between upper surface 603U and original lower surface 603L0 of top silicon substrate 603, which means that boron doping concentration gradient $d_{np1}$ fails to monotonically decrease between original lower surface 603L0 of top silicon substrate 603 and upper surface 604U of epitaxial layer 604, as is required for optimal sensor performance in some cases. Specifically, a first intermediate boron concentration level $n_{p\text{-}int11}$ occurring at upper surface 603U and a second boron concentration level $n_{p\text{-}int12}$ occurring at original lower surface 603L0 are less than maximum boron concentration level $n_{p\text{-}max10}$. The "dip" (i.e., the small decreased in concentration gradient levels between maximum boron concentration level $n_{p\text{-}max10}$ and second boron concentration level $n_{p\text{-}int12}$) occurs, for example, due to downward boron diffusion from top silicon substrate 603 into oxide layer 602 during epitaxial silicon growth, and the Y-axis location in which this dip occurs depends on, for example, the peak boron concentration level and the temperature during epitaxial silicon growth.

Referring to FIG. 6B, in order to "fix" doping concentration gradient $d_{np1}$, it is necessary to perform backside processing such that the thinning process includes the removal of at least the portion of top silicon layer 603 located between maximum boron concentration level $n_{p\text{-}max10}$ and original lower surface 603L0 (i.e., along with the entirety of handle substrate 601 and oxide layer 602), whereby maximum boron concentration level $n_{p\text{-}max10}$ coincides with revised lower surface 603L1. That is, removing the depicted lower portion of top silicon layer 603 effectively adjusts doping concentration gradient $d_{np1}$ such that maximum boron concentration level $n_{p\text{-}max10}$ occurs the backside sensor surface (i.e., revised lower surface 603L1) and monotonically decreases in the Y-axis direction to upper surface 604U. As described above, backside processing is immediately followed by the deposition of boron on revised lower surface 603L1 and the additional processes described above with reference to blocks 206 to 208 of FIG. 2 and blocks 407 to 409 of FIG. 4.

FIG. 6C depicts an alternative approach to fixing doping concentration gradient $d_{np1}$, where backside processing is performed such that the thinning process includes the removal of the entirety of top silicon layer 603 (i.e., along with the entirety of handle substrate 601 and oxide layer 602), whereby the new backside sensor surface is defined by exposing lower surface 604L of epitaxial layer 604. Doping concentration gradient $d_{np1}$ is thus "fixed" in that it has a new maximum boron concentration level $n_{p\text{-}max11}$, which is equal to boron concentration level $n_{p\text{-}int11}$, and monotonically decreases in the Y-axis direction from the new backside sensor surface (i.e., lower surface 604L) to upper surface 604U. Once top silicon layer 603 has been entirely removed, boron is deposited on exposed lower surface 604L, and the additional processes described above with reference to blocks 206 to 208 of FIG. 2 and blocks 407 to 409 of FIG. 4 are performed.

The above examples are not meant to limit the scope of the invention disclosed herein. They are meant merely as illustrations of how the top silicon substrate of an SOI wafer may be processed to include both the desired p-type dopant concentration gradient and then coated with a boron layer on its photo-sensitive surface. Because the top silicon substrate includes a concentration gradient of the p-type dopant which has its maximum value adjacent to the boron, the image sensor has high efficiency even for short-wavelength light, or low-energy charged particles, which may penetrate only a few nm, or a few tens of nm into the top silicon and epitaxial layers.

The various embodiments of the structures and methods of this invention that are described above are illustrative only of the principles of this invention and are not intended to limit the scope of the invention to the particular embodiments described. For example, additional steps may be added to the flow chart depicted in FIGS. 2 and 4, or some of the steps shown may be done in a different sequence than shown. Thus, the invention is limited only by the following claims and their equivalents.

The invention claimed is:

1. A method of fabricating an image sensor on a silicon-on-insulator (SOI) wafer including a top silicon substrate having an exposed first surface and an opposing second surface that is attached to a handling substrate by way of an intervening insulator layer, the method comprising:
utilizing a first boron layer to generate a first boron doping concentration level in the top silicon substrate;
generating an epitaxial layer on a first surface of the top silicon substrate;
forming circuit elements on a first surface of the epitaxial layer;
removing the handling substrate and the intervening insulator layer such that the second surface of the top silicon substrate is exposed; and
forming a pure boron layer on the exposed second surface of the top silicon substrate,
wherein utilizing the boron layer and generating said epitaxial layer are collectively performed such that boron diffusion from said top silicon substrate into the epitaxial layer generates a boron doping concentration gradient that monotonically decreases from a maximum boron concentration level disposed within the top silicon substrate to a minimum boron doping concentration level adjacent to the first surface of the epitaxial layer.

2. The method of claim 1, wherein utilizing the amorphous boron layer to generate said first boron concentration level comprises:
forming a first boron layer on the first surface of top silicon substrate;
processing the SOI wafer such that boron diffusion from the first boron layer generates an initial boron doping concentration level in the top silicon substrate, and such that the first boron layer is entirely removed from the first surface of the top silicon substrate.

3. The method of claim 2, wherein forming said first boron layer comprises depositing boron using a CVD process at a temperature in a range of 600° C. to 800° C.

4. The method of claim 2, wherein processing to generate said initial boron doping concentration level comprises performing a drive-in anneal at a temperature in a range of 800° C. to 900° C.

5. The method of claim 2, wherein processing to remove said first boron layer comprises maintaining the SOI wafer in a hydrogen atmosphere at a temperature in a range of 800° C. to 900° C.

6. The method of claim 5, wherein said processing comprises simultaneously generating said initial boron doping concentration level and removing said first boron layer.

7. The method of claim 2, wherein each of forming said first boron layer, performing said drive-in anneal, removing said first boron layer, and generating said epitaxial layer is performed while said SOI wafer is maintained within a CVD chamber.

8. The method of claim 1, wherein the method further comprises depositing an anti-reflection layer on a surface of the pure boron layer.

9. The method of claim 1, wherein the method further comprises forming a protective layer on the epitaxial layer over the circuit elements prior to removing said handling substrate and said intervening insulator layer.

10. The method of claim 1, wherein the method further comprises attaching a second handling substrate to the epitaxial layer over the circuit elements prior to removing said handling substrate and the intervening insulator layer.

11. The method of claim 1, wherein removing the handling substrate and the intervening insulator layer further comprises removing a portion of the top silicon substrate.

12. The method of claim 1, wherein said processing comprises simultaneously generating said initial boron doping concentration level and removing said first boron layer.

13. The method of claim 1, wherein the method further comprises depositing one of an anti-reflection layer on a surface of the pure boron layer.

14. A method of fabricating an image sensor on a silicon-on-insulator (SOI) wafer including a top silicon substrate having an exposed first surface and an opposing second surface that is attached to a handling substrate by way of an intervening insulator layer, the method comprising:

utilizing a first boron layer to generate a first boron doping concentration level in the top silicon substrate;

generating an epitaxial layer on a first surface of the top silicon substrate such that boron diffusion from said top silicon substrate generates a boron doping concentration gradient that monotonically decreases in the epitaxial layer from a maximum boron concentration level disposed adjacent to the first surface of the top silicon substrate to a minimum boron doping concentration level disposed adjacent to a second surface of the epitaxial layer;

forming circuit elements on the second surface of the epitaxial layer;

removing the handling substrate, the intervening insulator layer and the top silicon substrate such that a third surface of the epitaxial layer is exposed; and forming a pure boron layer on the exposed third surface of the epitaxial layer.

15. The method of claim 14, wherein utilizing the amorphous boron layer to generate said first boron concentration level comprises:

forming a first boron layer on the first surface of top silicon substrate;

processing the SOI wafer such that boron diffusion from the first boron layer generates an initial boron doping concentration level in the top silicon substrate, and such that the first boron layer is entirely removed from the first surface of the top silicon substrate.

16. The method of claim 15, wherein forming said first boron layer comprises depositing boron using a CVD process at a temperature in a range of 600° C. to 800° C.

17. The method of claim 15, wherein processing to generate said initial boron doping concentration level comprises performing a drive-in anneal at a temperature in a range of 800° C. to 900° C.

18. The method of claim 15, wherein processing to remove said first boron layer comprises maintaining the SOI wafer in a hydrogen atmosphere at a temperature in a range of 800° C. to 900° C.

19. The method of claim 15, wherein each of forming said first boron layer, performing said drive-in anneal, removing said first boron layer, and generating said epitaxial layer is performed while said SOI wafer is maintained within a CVD chamber.

* * * * *